(12) United States Patent
Jaeck et al.

(10) Patent No.: US 6,794,760 B1
(45) Date of Patent: Sep. 21, 2004

(54) INTEGRATED CIRCUIT INTERCONNECT

(75) Inventors: Edward Jaeck, Phoenix, AZ (US);
Ronald I. Spreitzer, Phoenix, AZ (US);
Robert M. Nickerson, Chandler, AZ (US); Lesley A. Polka, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/656,413

(22) Filed: Sep. 5, 2003

(51) Int. Cl.[7] ................................................. H01L 29/40
(52) U.S. Cl. ...................... 257/784; 257/786; 438/617; 438/612
(58) Field of Search ............................... 438/612, 617; 257/784, 786

(56) References Cited

U.S. PATENT DOCUMENTS 5,459,284 A * 10/1995 Bockelman et al. .......... 174/34
5,471,010 A * 11/1995 Bockelman et al. .......... 174/36

* cited by examiner

*Primary Examiner*—Roy Potter
(74) *Attorney, Agent, or Firm*—Buckley, Maschoff & Talwalkar LLC

(57) ABSTRACT

A system may include an integrated circuit die, a package, and an interconnect. The integrated circuit die may include a conductive die pad, the package may include a conductive package pad, and the interconnect may include two or more stranded wires. A first end of the interconnect is electrically coupled to the conductive die pad, and a second end of the interconnect is electrically coupled to the package pad.

19 Claims, 5 Drawing Sheets

INTEGRATED CIRCUIT INTERCONNECT

BACKGROUND

An integrated circuit (IC) package is used to electrically couple an IC die to external components and circuitry. An IC package also serves to protect an IC die and to provide a suitable operating environment thereto. These functions may include temperature regulation, impedance matching, and optimization of I/O and power delivery paths. The design of IC package elements may therefore affect the efficiency and/or speed at which an IC die can operate.

DETAILED DESCRIPTION

Figure 1:
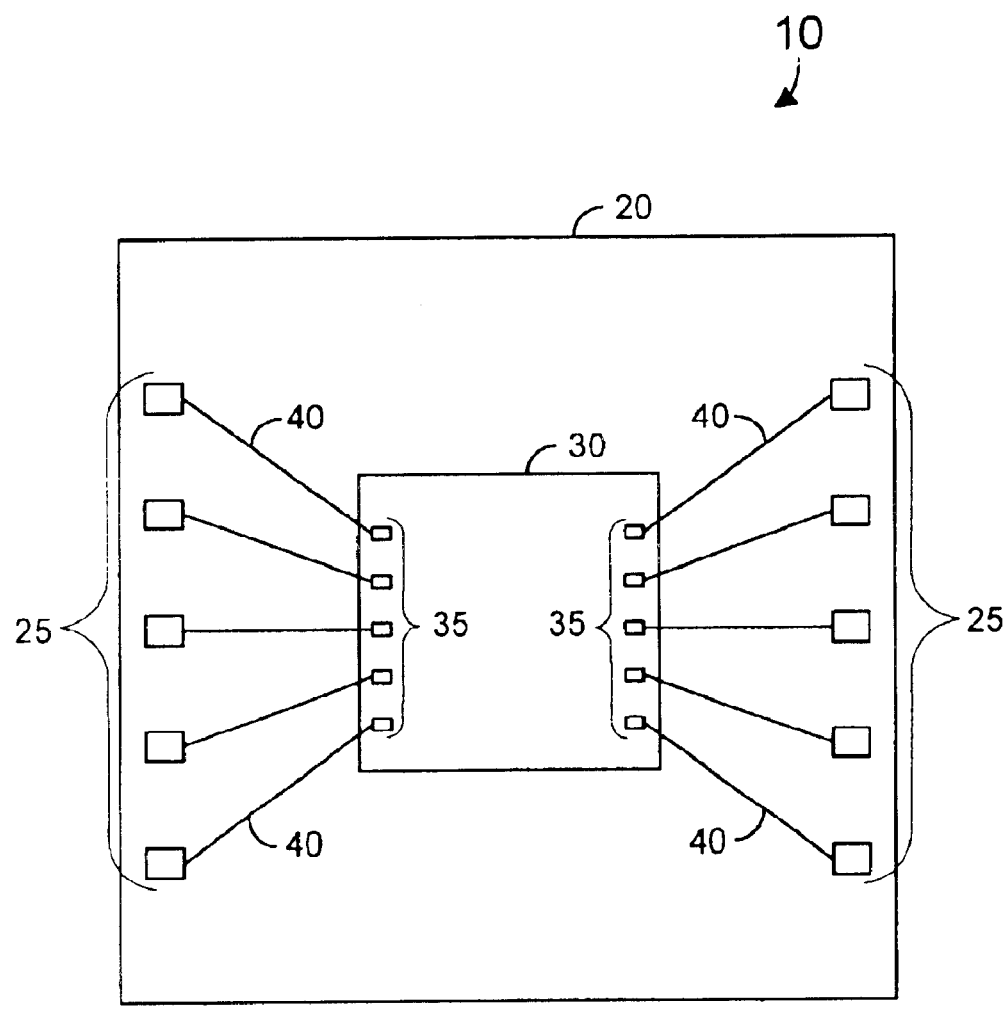
FIG. 1 is a top view of an apparatus according to some embodiments.

FIG. 1 is a top view of apparatus 10 according to some embodiments. Apparatus 10 comprises IC package 20 and IC die 30. Apparatus 10 may comprise a microprocessor such as an Intel® PXA800F® cellular processor. Embodiments are not limited to this type of microprocessor or to microprocessors in general.

Package 20 may comprise any ceramic, organic, and/or other suitable material including a physical interface for receiving die 30. According to some embodiments, package 20 is a surface-mountable substrate such as an Organic Land Grid Array substrate that may be mounted directly onto a motherboard or mounted on a pinned interposer which mates with a socket of a motherboard. Packaging systems other than those mentioned herein may be used in conjunction with some embodiments.

Package 20 includes conductive package pads 25. Conductive package pads 25 may comprise any conductive structure for achieving an electrical connection with an external conductor, including but not limited to a copper pad with nickel and/or gold plating. One or more of conductive package pads 25 may be electrically coupled to microstriplines and/or vias within package 20 that are in turn coupled to external interface elements such as the aforementioned Land Grid Array. Conductive package pads 25 need not be identical to one another, although such an arrangement may simplify their manufacture.

IC die 30 may be fabricated using any suitable substrate material and fabrication technique and may provide any functions. In some embodiments, IC die 30 comprises a microprocessor chip having a silicon substrate. IC die 30 includes conductive die pads 35, which may comprise gold-plated copper contacts. One or more of conductive die pads 35 may be electrically coupled to electrical circuitry that is integrated into die 30.

Interconnects 40 electrically couple the electrical circuitry of IC die 30 to package 20. In some embodiments such as that illustrated in FIG. 1, each of interconnects 40 includes a first end and a second end, with the first end being electrically coupled to one of conductive die pads 35 and with the second end being electrically coupled to one of conductive package pads 25. According to some embodiments, at least one of conductive package pads 25 is electrically coupled to two or more of conductive die pads 35. At least one of conductive die pads 25 is electrically coupled to two or more of conductive package pads 35 according to some embodiments.

At least one of interconnects 40 comprises at least two stranded wires. The at least one interconnect may also include other elements, and is not limited to the at least two stranded wires. The at least two wires are termed "stranded" because they are twisted together or otherwise physically coupled. At least two of the stranded wires in the at least one interconnect 40 are not insulated from each other.

Figure 2:
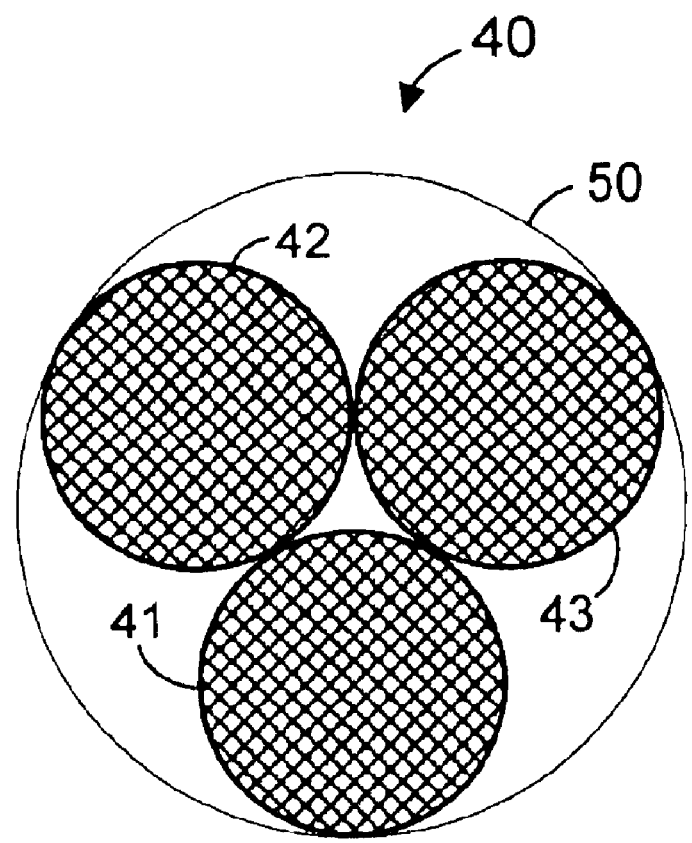
FIG. 2 is a cross-sectional view of an interconnect according to some embodiments.

FIG. 2 illustrates a cross-section of one of interconnects 40 according to some embodiments. The illustrated interconnect 40 includes three conductors 41 through 43 of circular cross section. Conductors 41 through 43 are circumscribed by boundary 50. Boundary 50 does not necessarily represent any physical element, but is intended to show an embodiment in which conductors 41 through 43 are disposed within a particular area. In some embodiments, the diameter of boundary 50 is 1 mil. Although boundary 50 is shown as a circular shape, boundary 50 may comprise other shapes according to some embodiments.

Interconnect 40 of FIG. 2 may present less AC skin effect resistance than a single 1 mil wire due to increased surface area. Interconnect 40 may also provide less inductance than the single 1 mil wire due to its multiple current paths. Such effects may be particularly evident at high frequencies.

Conductors 41 through 43 may comprise any conductive material, including but not limited to gold, copper, silver, and conductive polymers. The composition of each of conductors 41 through 43 need not be identical according to some embodiments. Moreover, the shapes of each conductor 41 through 43 may differ in some embodiments. According to some embodiments, conductors 41 through 43 may define a boundary of a shape and/or size that differs from boundary 50.

Figure 3C:
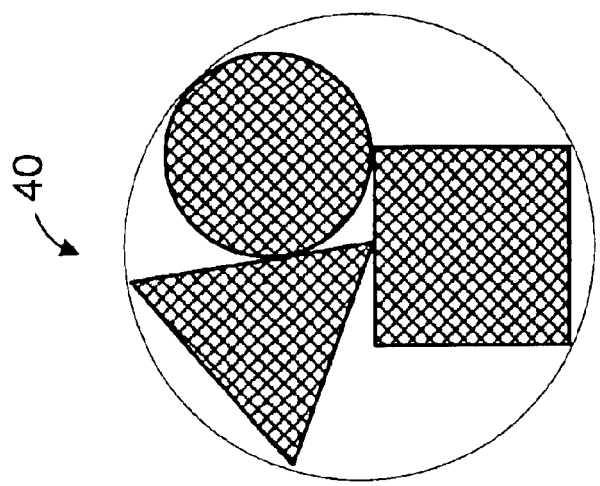
FIGS. 3a through 3c are cross-sectional views of interconnects according to some embodiments.
Figure 3B:
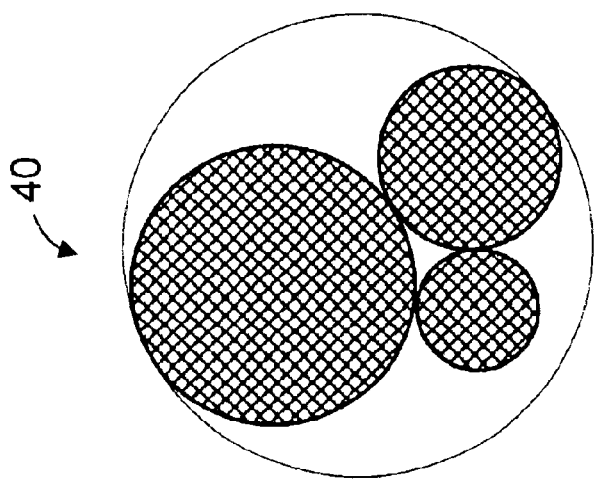
Figure 3A:
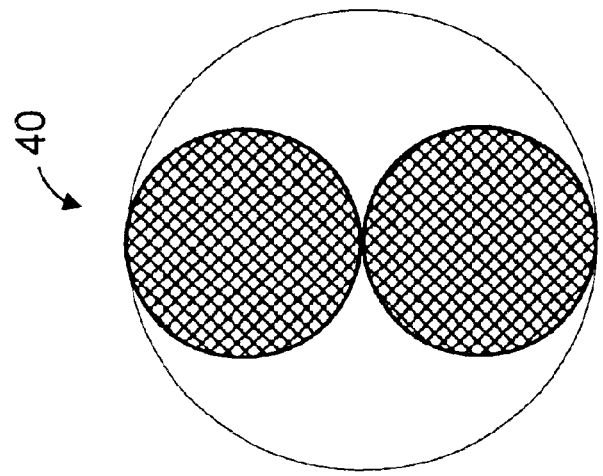

FIGS. 3a through 3c illustrate different configurations of interconnect 40 according to some embodiments. FIG. 3a shows interconnect 40 consisting of two stranded wires, and FIG. 3b shows interconnect 40 consisting of three stranded wires. The two stranded wires of FIG. 3a are of identical shape, the three stranded wires of FIG. 3b are of different shapes, and the three stranded wires of FIG. 3c are of different shapes. Any combination of wire configurations and/or compositions may be used in conjunction with some embodiments. Each different configuration and/or composition may present unique electrical characteristics. A designer may therefore optimize the electrical performance of system 10 by selecting appropriate interconnects according to some embodiments.

As mentioned above, an interconnect according to the invention may comprise two or more stranded wires. Each of these wires may have a first end and a second end. In order to mount such an interconnect as shown in FIG. 1, the first end of each stranded wire may be bonded to a conductive die pad using a first bond. The first bond may be generated using any currently- or hereafter-known system for bonding a single strand of wire to a conductive die pad. In some embodiments, the first ends are bonded to the conductive die pad substantially simultaneously. The second ends of the wires may be bonded to a conductive package pad using a second bond. Again, the second ends may be bonded to the conductive package pad substantially simultaneously.

Figure 4:
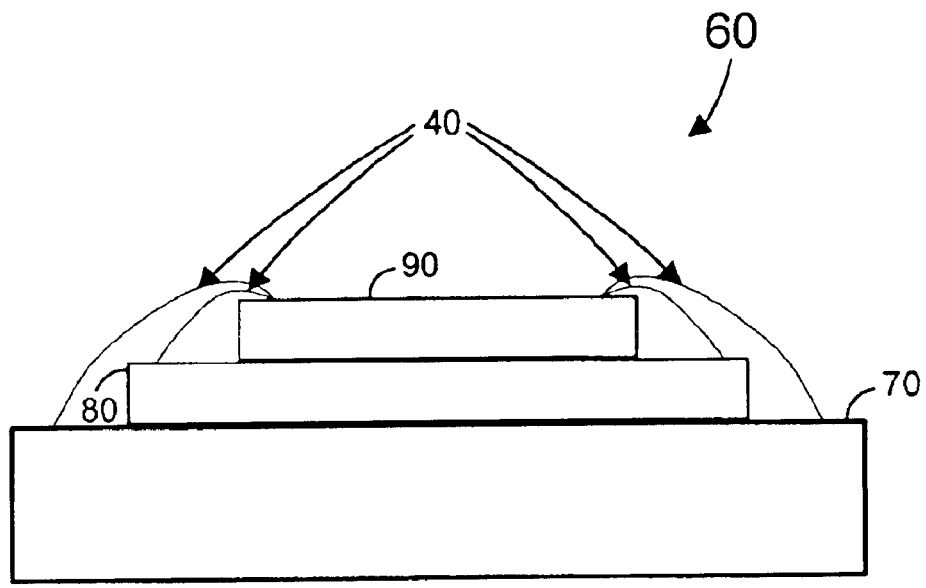
FIG. 4 is a side elevation of an apparatus according to some embodiments.

FIG. 4 shows a side elevation of apparatus 60 according to some embodiments. Apparatus 60 includes package 70 and die 80, which may respectively correspond to package 20 and die 30. Apparatus 60 also includes IC die 90 in a "stacked die" configuration. Die 90 may provide functions that are different from or redundant to the functions provided by die 80.

Die 90 may include conductive die pads (not shown) that are electrically coupled to the circuitry integrated within die 90. The die pads may be electrically coupled to one or more interconnects consisting of two or more stranded wires. A first end of an interconnect may be electrically coupled to a conductive die pad of die 90 and a second end of the interconnect may be electrically coupled to a conductive die pad of die 80. According to some embodiments, a first end of an interconnect may be electrically coupled to a conductive die pad of die 90 and a second end of the interconnect may be electrically coupled to a conductive package pad of package 70.

Figure 5:
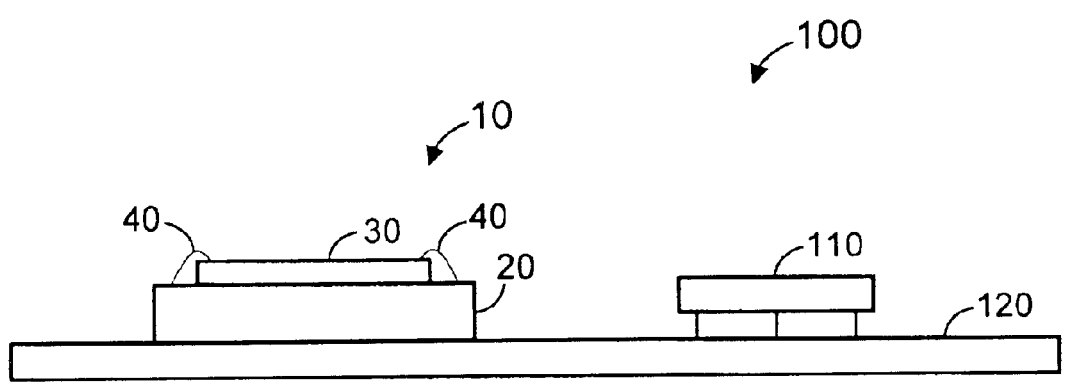
FIG. 5 is a side elevation of a system according to some embodiments.

FIG. 5 illustrates a system according to some embodiments. System 100 includes apparatus 10 of FIG. 1, memory 110 and motherboard 120. System 100 may comprise components of a wireless device platform, or any other suitable platform. Memory 110 may comprise any type of memory for storing data, such as a Single Data Rate Random Access Memory, a Double Data Rate Random Access Memory, or a Programmable Read Only Memory.

Memory 110 and motherboard 120 may be electrically coupled to package 20 of system 100. More particularly, motherboard 120 may comprise a memory bus (not shown) coupled to package 20 and to memory 110. In operation, motherboard 120 may route input/output signals between memory 110 and package 20. The input/output signals may be transmitted between package 20 and die 30 via interconnects 40.

The several embodiments described herein are solely for the purpose of illustration. Some embodiments may include any currently or hereafter-known versions of the elements described herein. Therefore, persons skilled in the art will recognize from this description that other embodiments may be practiced with various modifications and alterations.

What is claimed is:

1. An apparatus comprising:

an integrated circuit die comprising a conductive die pad;

a package comprising a conductive package pad; and an interconnect comprising two or more stranded wires, a first end of the interconnect electrically coupled to the conductive die pad, and a second end of the interconnect electrically coupled to the package pad.

2. An apparatus according to claim 1, wherein the integrated circuit die further comprises a second conductive die pad, wherein the package comprises a second conductive package pad, further comprising:

a second interconnect comprising two or more stranded wires, a first end of the second interconnect electrically coupled to the second conductive die pad, and a second end of the second interconnect electrically coupled to the second package conductive pad.

3. An apparatus according to claim 1, further comprising:

a second integrated circuit die comprising a second conductive die pad; and a second interconnect comprising two or more stranded wires, a first end of the second interconnect electrically coupled to the second conductive die pad, and a second end of the second interconnect electrically coupled to a second conductive package pad of the package.

4. An apparatus according to claim 1, further comprising:

a second integrated circuit die comprising a third conductive die pad; and a second interconnect comprising two or more stranded wires, a first end of the second interconnect electrically coupled to a second conductive die pad of the integrated circuit die, and a second end of the second interconnect electrically coupled to the third conductive die pad.

5. An apparatus according to claim 1, wherein a shape of at least one of the two or more stranded wires is different from a shape of at least one other of the two or more stranded wires.

6. An apparatus according to claim 5, wherein a cross-sectional shape of the at least one of the two or more stranded wires is different from a cross-sectional shape of the at least one other of the two or more stranded wires.

7. An interconnect comprising:

a first wire; and a second wire, a first end of the first wire and a first end of the second wire to bond to a conductive die pad of an integrated circuit die substantially simultaneously, and a second end of the first wire and a second end of the second wire to bond to a conductive package pad of an integrated circuit package substantially simultaneously.

8. An interconnect according to claim 7, wherein the first wire and the second wire are stranded.

9. An interconnect according to claim 8, wherein a shape of the first wire is different from a shape of the second wire.

10. An interconnect according to claim 9, wherein a cross-sectional shape of the first wire is different from a cross-sectional shape of the second wire.

11. A method comprising:

bonding a first wire and a second wire to a conductive die pad of an integrated circuit die using a first bond; and bonding the first wire and the second wire to a conductive package pad of an integrated circuit package using a second bond.

12. A method according to claim 11, wherein the two wires are stranded.

13. A method according to claim 12, wherein a shape of the first wire is different from a shape of the second wire.

14. A method according to claim 11, wherein bonding the first wire and the second wire to the conductive die pad comprises bonding a first end of the first wire and a first end of the second wire to the conductive die pad substantially simultaneously, and wherein bonding the first wire and the second wire to the conductive package pad comprises bonding a second end of the first wire and a second end of the second wire to the conductive package pad substantially simultaneously.

15. A system comprising:

an integrated circuit die comprising a conductive die pad;

a package comprising a conductive package pad;

an interconnect comprising two or more stranded wires, a first end of the interconnect electrically coupled to the conductive die pad, and a second end of the interconnect electrically coupled to the package pad; and a double data rate memory electrically coupled to the package.

16. A system according to claim 15, further comprising:

a motherboard coupled to the package and to the memory.

17. A system according to claim 15, further comprising:

a second interconnect comprising two or more stranded wires, a first end of the second interconnect electrically coupled to a second conductive die pad of the integrated circuit die, and a second end of the second interconnect electrically coupled to a second package conductive pad of the package.

18. A system according to claim 15, further comprising:

a second integrated circuit die comprising a second conductive die pad; and a second interconnect comprising two or more stranded wires, a first end of the second interconnect electrically coupled to the second conductive die pad, and a second end of the second interconnect electrically coupled to a second conductive package pad of the package.

19. A system according to claim 15, wherein a shape of at least one of the two or more stranded wires is different from a shape of at least one other of the two or more stranded wires.

\* \* \* \* \*